United States Patent

[11] 3,590,273

[72] Inventor Denis Brian Jarvis
Eastleigh, England

[21] Appl. No. 799,441
[22] Filed Feb. 14, 1969
[45] Patented June 29, 1971
[73] Assignee U.S. Philips Corporation
[32] Priority Feb. 15, 1968
[33] Great Britain
[31] 7456-68

[54] FOUR PHASE LOGIC SYSTEMS
2 Claims, 3 Drawing Figs.

[52] U.S. Cl. ........ 307/205, 307/208, 307/221, 307/251
[51] Int. Cl. ........ H03k 19/08
[50] Field of Search ........ 307/205, 251, 279, 304, 208, 221 C

[56] References Cited

UNITED STATES PATENTS

| | | | |
|---|---|---|---|
| 3,480,796 | 11/1969 | Polkinghorn et al. | 307/205 X |
| 3,483,400 | 12/1969 | Washizuka et al. | 307/279 |
| 3,497,715 | 2/1970 | Yen | 307/205 |
| 3,506,851 | 4/1970 | Polkinghorn et al. | 307/251 |

*Primary Examiner*—John S. Heyman
*Attorney*—Frank R. Trifari

ABSTRACT: An interface circuit for connecting two chips of a four phase MOST integrated circuit uses four interconnected MOST's switched by the alternate and nonconcurrent pulses of two separate phases of a group of four phase clock signals.

PATENTED JUN 29 1971 3,590,273

INVENTOR.
DENIS BRIAN JARVIS
BY
Frank R. [signature]
AGENT

FOUR PHASE LOGIC SYSTEMS

THE PRESENT INVENTION concerns four phase logic systems employing metal on insulator on silicon transistors, which are also known as insulated gate field effect transistors. Transistors of this kind will hereinafter be referred to as MOST's. The four phases will hereinafter be referred to as the $\phi_1, \phi_2, \phi_3$ and $\phi_4$ phases.

The present invention is particularly concerned with logic systems employing as a basic unit shift registers formed by a number of MOST's in which the information is stored by means of the stray capacitances of the MOST's in the register. This is possible because of the very high input impedance of the MOST's. A typical shift register will be described by way of example later in this specification.

Logic systems of the kind to which this invention relates are particularly suited to construction as integrated circuits, in which case a large number of logical functions can be performed by a single integrated circuit unit or chip. However, it is often necessary for a logic system to be partitioned between a number of different chips. This causes difficulties when using shift registers of the kind using the stray capacitances of MOST's as memory stores, as it is necessary to interconnect the various chips by leads. Thus any small stray coupling capacitances between the leads and the external sources of electrical disturbances can produce unwanted noise and incorrect signals.

The present invention has for an object to provide a circuit for overcoming this disadvantage without an additional power source.

According to the present invention there is provided an interface for interconnecting two chips of an integrated four phase logic system. The interface comprises an input MOST on whose gate capacitance the logic signal is stored. The input MOST has its source electrode grounded and its drain electrode arranged to be connected to the lead interconnecting the two chips. A second MOST is arranged to be connected between a clock pulse input and the lead in the source-follower configuration. The lead also is connected to the gate electrode of a third MOST. The source of the third MOST is connected to a second clock pulse input and the drain electrode thereof is connected to the source electrode of a fourth MOST. The fourth MOST is connected in the source-follower configuration to the second clock pulse input. The junction between the third and fourth MOST's provides the output of the interface.

In a four phase logic system the two clock pulse inputs will be the $\phi_1$, $\phi_3$ inputs, but which input is which will be determined by the location of the interface in a specific logic system.

One embodiment of the present invention will now be described by way of example and with reference to the accompanying drawings in which.

Figure 1:
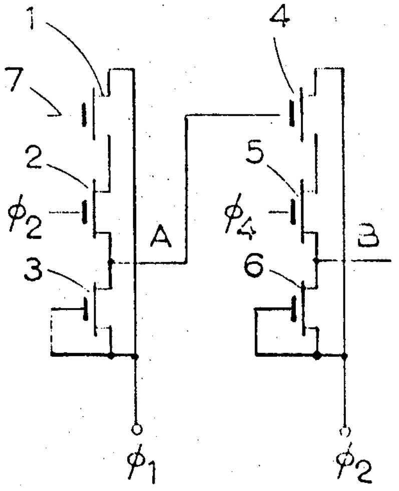
FIG. 1 is a circuit diagram of one stage of a four phase shift register.

The shift register shown in FIG. 1 consists of six P-channel enhancement MOST's which are numbered 1—6. The data input to the shift register is the input 7, while $\phi_1, \phi_2, \phi_3$ and $\phi_4$ indicate the four clock pulse inputs. As P-enhancement MOST's are used the clock pulses are negative, and a logical "one" at the input 7 is also given by a negative voltage.

Figure 2:
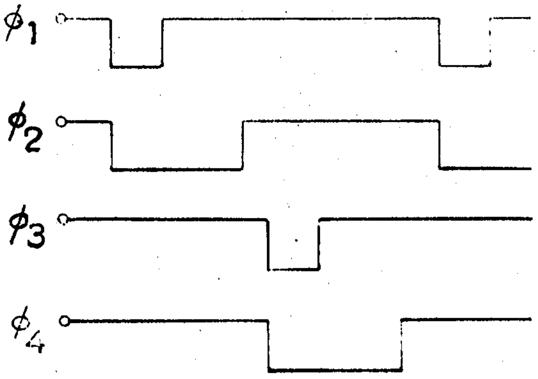
FIG. 2 shows the clock pulse pattern to the shift register of FIG. 1.

The clock pulse cycle to the shift register is shown in FIG. 2 and the whole cycle extends between the leading edges of the $\phi_1$ clock pulses. In the rest of the specification, when, for example, $\phi_1$ is referred to this means that period during which a $\phi_1$ pulse is present at the $\phi_1$ input.

An example of this operation of this shift register is as follows: during the $\phi_1$ the point A is changed to a negative value through MOST 3. However, because input $\phi_4$ is still at 0, this has no effect on output B. If the input at 7 is "1" (negative), then at the end of $\phi_1$ and before the end of $\phi_2$ the charge at the point A can be discharged through MOST 1 until the voltage at A is nearly zero. However, if input 7 is at "0" then the point A cannot discharge as MOST 1 is turned off and no discharge path has been established. Point A accordingly remains at the negative level. As can be seen the second stage of the shift register is identical to the first stage, and the value of the charge at point B is consequently controlled by the clock pulses $\phi_3, \phi_4$ and the values of the charge at the point A.

The input MOST's 1 and 4 of the shift register can be replaced by any required series parallel combination of MOST's in order to perform logic at either stage. A shift register of this kind has a number of advantages amongst which are:

1. low power dissipation because at no time during a logic cycle is a DC current passed. This is because current only flows during changes in voltages to charge and discharge capacitances;
2. the smallest size MOST's available can be used, thus reducing area and cost; and
3. the system has a higher speed than similar two phase systems.

The present invention is concerned with providing a circuit which can act as an interface between one stage of a shift register of the kind described, and a further stage or logical circuit, requiring fairly low power dissipation and without requiring any additional power sources yet being very tolerant of external interference signals.

Figure 3:
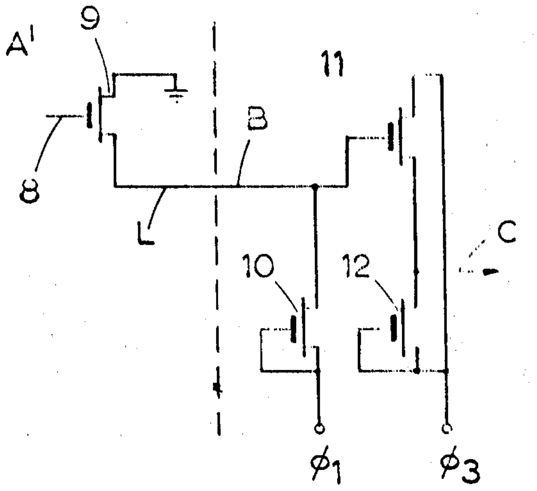
FIG. 3 is a high noise immunity interface constructed in accordance with the invention.

Such an interface is shown in FIG. 3 of the accompanying drawings and the input 8 of this interface is taken from the output (point B) of the shift register of FIG. 1. The interface consists of four MOST's 9 to 12, MOST's 10 and 12 being coupled in the source-follower configuration to the $\phi_1$ and $\phi_3$ clock pulse inputs. The lead connecting two chips is indicated at L. The value of the signal at the input 8 (point A') is of course finally dependent on the preceding register stage.

Assuming that the interface is connected to the register stage, at $\phi_3$ both points A' and C go negative. Between the end of $\phi_3$ and the end of $\phi_4$, point A either remains or goes to 0 in accordance with the logical input to the shift register to which the interface is coupled. If point A stays negative (a logical "1"), then the MOST 9 is turned on. Thus point B is connected to an "on" MOST with low impedance to ground depending on the size of the MOST 9. This size can be chosen at will.

At $\phi_3$ point C is taken to "1" and this is the required output. If at $\phi_4$ in the previous stage point A is taken to 0 then MOST 9 is turned off. Unwanted noise signals can then burn MOST 11 on and discharge point C to earth.

However, during $\phi_1$ MOST 11 is turned on, and C is discharged to earth in any case. The noise has accordingly only caused a slightly premature reaction which would in any case have happened and which thus does not disturb the logic. An "0" is given from MOST 11 at $\phi_1$, and this would have been the case as A' is at "0" and this is the value which had to be transmitted by the interface across the lead. At $\phi_3$ the logical value "0" at C is then transferred to the input stage of another shift register, or to a logical system connected prior to the shift register.

Although the interface has been described as following a shift register, it could in fact be positioned between two halves of a shift register, that is between that half connected to the $\phi_1$, $\phi_2$ inputs and the half connected to the $\phi_3$, $\phi_4$ inputs. In such a case the clock inputs to the MOST's 10 and 12 would have to be interchanged.

Finally, although the shift register and interface have been described with P-type enhancement MOSTS, N-type enhancement MOSTS could also be used provided that the voltage polarities were reversed.

What I claim is:

1. An interface for interconnecting two chips of an integrated four-phase logic system, comprising a first MOST on a first of the two chips and having source, drain and gate terminals, the gate terminal of the first MOST comprising the input terminal of the interface, means for connecting the source terminal of the first MOST to ground, a second MOST on the second of the two chips having source, drain and gate terminals, a third MOST on the second chip having source, drain and gate terminals, a fourth MOST on the second chip having source, drain and gate terminals, means for connecting the drain terminal of the first MOST to the gate terminal of the third MOST and to the source terminal of the second MOST, means for interconnecting the drain terminal of the third MOST with the source terminal of the fourth MOST, the source terminal of the fourth MOST comprising the output terminal of the interface, means for connecting the gate and drain terminals of the second MOST to an input terminal for a first phase of spaced clock pulses, and means for connecting the gate and drain terminals of the fourth MOST and the source terminal of the third MOST to an input terminal for a third phase of spaced clock pulses occurring alternately and nonconcurrently with the clock pulses of the first phase.

2. An interface as claimed in claim 1, wherein each of the MOSTS are P-channel enhancement MOSTS.